United States Patent
Cooper

(10) Patent No.: US 6,397,357 B1
(45) Date of Patent: May 28, 2002

(54) METHOD OF TESTING DETECTION AND CORRECTION CAPABILITIES OF ECC MEMORY CONTROLLER

(75) Inventor: Steve Cooper, Cedar Park, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 08/727,256

(22) Filed: Oct. 8, 1996

(51) Int. Cl.⁷ .......................... G06F 11/00; G11C 29/00
(52) U.S. Cl. ........................................ 714/703; 714/763
(58) Field of Search ............................ 371/3, 8.1, 80.4, 371/21.1, 21.2, 21.3, 22.1, 37.1, 37.7, 37.3, 37.6, 40.1, 40.2, 51.1, 67.1; 395/183.04, 183.06, 183.07, 182.03, 182.04; 364/266, 266.4, 268, 269.2, 269.3, 934.9, 934.91, 944

(56) References Cited

U.S. PATENT DOCUMENTS

| | | | |
|---|---|---|---|
| 4,358,848 A | 11/1982 | Patel | 371/38.1 |
| 4,561,095 A * | 12/1985 | Khan | 371/40.1 |
| 5,142,541 A * | 8/1992 | Kim et al. | 371/40.2 |
| 5,198,154 A * | 3/1993 | Kitajima et al. | 364/268 |
| 5,305,326 A * | 4/1994 | Solomon et al. | 395/182.04 |
| 5,335,234 A | 8/1994 | Matteson et al. | 371/40.1 |
| 5,384,788 A | 1/1995 | Parks et al. | 371/37.7 |
| 5,423,029 A | 6/1995 | Schieve | 395/183.18 |
| 5,463,643 A | 10/1995 | Gaskins et al. | 371/40.1 |
| 5,477,551 A | 12/1995 | Parks et la. | 371/37.7 |
| 5,481,552 A * | 1/1996 | Aldereguia et al. | 371/40.1 |
| 5,502,732 A | 3/1996 | Arroyo et al. | 371/30 |

\* cited by examiner

Primary Examiner—Christine T. Tu
(74) Attorney, Agent, or Firm—Haynes and Boone, LLP

(57) ABSTRACT

System and method for testing the error detection and correction ("ECC") capabilities of an ECC memory controller are disclosed. The system uses the natural state of the bus to induce one- or two-bit memory errors by disabling the ECC capabilities of the controller and then writing a test data pattern that is one or two bits different than a data pattern that would result in an ECC code equal to the natural state of the bus and an ECC code equal to the natural state of the bus to a selected memory location. At that point, the ECC capabilities of the memory controller are reenabled and the memory location to which the test data pattern was previously written is read and its ECC code generated. A determination is then made whether the memory controller detected and/or corrected the induced error.

23 Claims, 1 Drawing Sheet

METHOD OF TESTING DETECTION AND CORRECTION CAPABILITIES OF ECC MEMORY CONTROLLER

TECHNICAL FIELD

The invention relates generally to error checking and correcting. ("ECC") memory controllers and more specifically to a method of testing the error detection and correction capabilities of an ECC memory controller.

BACKGROUND OF THE INVENTION

Historically, the most common method of protecting the integrity of memory devices in computers has been through use of parity schemes. While parity schemes provide the ability to detect single bit memory errors, they are not capable of correcting such errors. In contrast, error correcting and checking, or "ECC," technology provides the ability both to detect and correct single bit memory errors. However, because ECC requires expensive, specialized memory SIMMs, until recently, parity technology has remained the predominant memory protection method.

ECC employs additional bits called "check bits" in which is stored information required to detect and correct single bit errors, as well as to detect, but not correct, double bit errors. The number of check bits required to protect a block of memory varies according to the size of the block. As illustrated in Table I below, for smaller blocks, parity requires far fewer additional bits than ECC; however, with the 64-bit data bus on certain commercially available processors, such as the Pentium Pro, available from Intel Corporation, ECC can be accomplished using the same number of additional bits as would be required for parity.

TABLE I

| Block Size | Parity Bits | ECC Bits |
|---|---|---|
| 8 | 1 | 5 |
| 16 | 2 | 6 |
| 32 | 4 | 7 |
| 64 | 8 | 8 |

This explains, at least in part, the current popularity of ECC as a memory protection scheme. An exemplary ECC system is described in U.S. Pat. No. 4,358,848 to Patel, the disclosure of which is hereby incorporated by reference in its entirety.

State of the art memory controllers include ECC logic for generating check bits, or an ECC code, that correspond to a particular data value being written to memory and is stored in memory along with the data value. When data is subsequently read from memory, an ECC code is calculated for the read data and compared with the ECC code stored therewith by XORing the two codes. The result of the XOR operation, referred to as the "syndrome", if nonzero, indicates that an error has occurred.

During normal operation of a computer system, an ECC code will be encountered during every read from and write to system memory. For this reason, it is extremely important that ECC logic embedded in the memory controller be functioning properly. In the event that a single bit memory error is detected, the ECC logic reports and corrects the error. In the case of double bit memory errors, the error is not corrected, but is reported, by the ECC logic.

Many systems exist which use ECC technology to ensure the integrity of system memory. In contrast, very few systems exist for testing the validity of the ECC logic of the memory controller itself. Those systems that do exist, such as the system described in U.S. Pat. No. 5,502,732 to Arroyo et al., require the memory controller to be modified to include specialized hardware for testing the ECC logic embedded therein. Clearly, such hardware systems are deficient in that they fail to provide a universal system and method for testing the ECC capabilities of unmodified ECC memory controllers. The ability to test the ECC logic itself is important because if the ECC logic is faulty, the integrity of system memory may be incorrectly evaluated.

Therefore, what is needed is an improved method and apparatus for testing the operation of an ECC-capable memory controller that does not require hardware modification of the memory controller.

SUMMARY OF THE INVENTION

The present invention, accordingly, provides a system and method for testing the error detection and correction capabilities of an ECC memory controller that reduces or overcomes disadvantages and limitations associated with prior methods and systems. In a departure from the art, the system of the present invention is implemented entirely in software; accordingly, it can be used to verify the operation of nearly any ECC memory controller and requires no special hardware modification.

In a preferred embodiment, the invention takes advantage of the natural state of the bus to induce one- or two-bit memory errors as follows. First, the ECC generation capabilities of the memory controller are disabled, such that ECC check bits will not be generated for data read from and written to system memory. Next, a test data pattern that is one bit different than a data pattern that results in an ECC code equal to the natural state of the bus is written to a selected location in system memory. For example, assuming in its natural state, the bus is pulled low, a data pattern of 0000000000000000h would result in an ECC code equal to the natural state of the bus (00000000b); therefore, an appropriate test pattern would be 0000000000000001h. It will be recognized that the foregoing will result in a one-bit memory error being induced.

ECC generation capabilities are then reenabled, such that ECC codes will be generated and compared, by XORing the codes, on each read from and write to memory, at which point, the memory location to which the test data pattern was previously written is read and its ECC code generated. A determination is then made whether the memory controller detected and corrected the induced error and, if so, whether the memory controller reported the error.

Double-bit errors may be induced in a similar manner, it being understood that detection and reporting, but not correction, should be expected of a correctly functioning ECC memory controller.

If it is determined that the ECC memory controller is not functioning properly, either the memory controller or the entire motherboard of the computer must be replaced.

A technical advantage achieved with the invention is that it enables the operation of any ECC memory controller to be verified.

A further technical advantage achieved with the invention is that it is implemented entirely in software; therefore, no hardware modification of the memory controller is required.

DESCRIPTION OF THE PREFERRED EMBODIMENT

Figure 1:
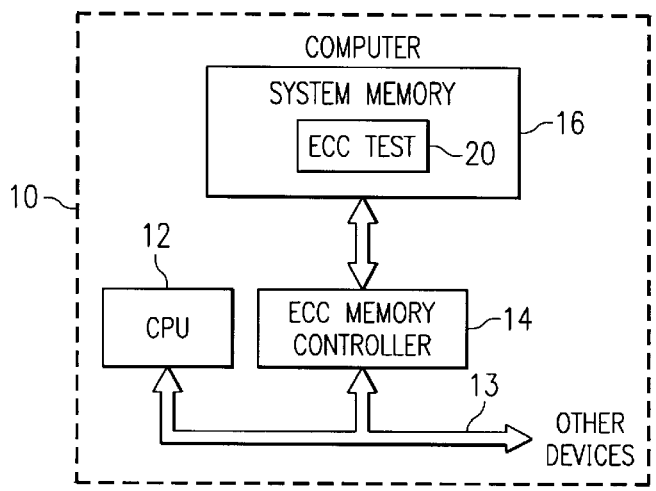
FIG. 1 is a partial block diagram of a personal computer for implementing the system of the present invention.
Figure 2:
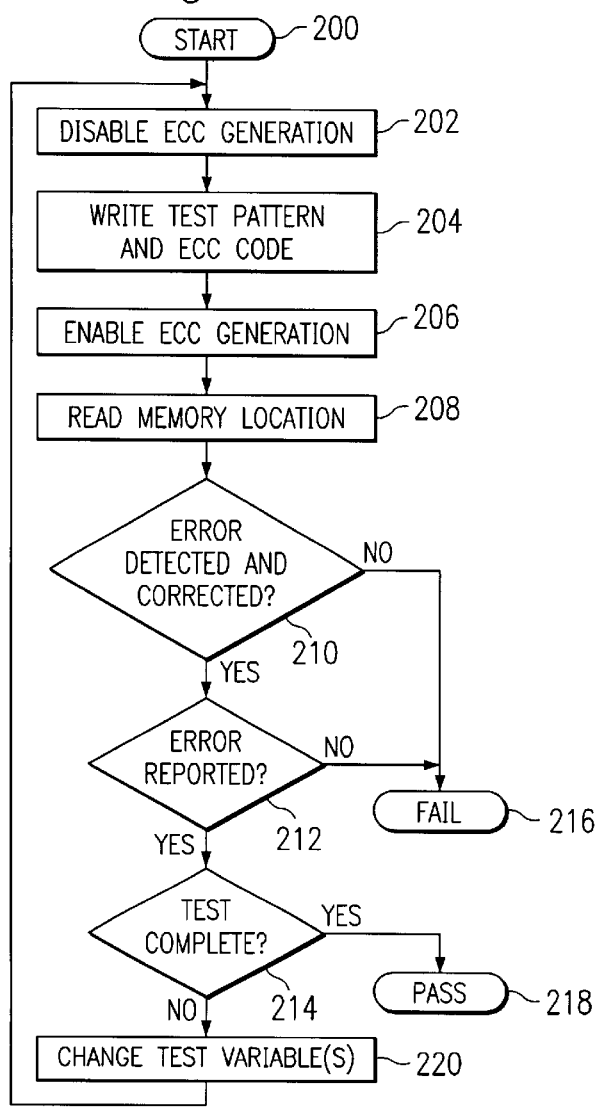
FIG. 2 is a flow chart of the operation of software for implementing the system of the present invention.

Referring to FIG. 1, the reference numeral 10 designates generally a computer system embodying features of the present invention. As shown in FIG. 1, the computer 10 comprises a central processing unit, or CPU, 12 connected via a bus 13 to an ECC-capable memory controller 14, which controls access to a system memory 16. In a preferred embodiment, the CPU 12 is a 64-bit microprocessor, such as Intel's Pentium Pro. Instructions for execution by the CPU 12 for implementing the ECC testing system of the present invention, as further described in detail with reference to FIG. 2, are stored in system memory 16 and designated generally by the reference numeral 20. It will be recognized that other I/O devices necessary and desirable for the proper operation of the computer 10 will also be connected to the bus 13.

In accordance with a feature of the present invention, the ECC generation capabilities of the controller 14 may be selectively enabled, in which case ECC check bits will be generated and compared, by XORing the codes, for each data value read from and written to memory 16, and disabled, in which case ECC check bits will not be generated in connection with each memory access. Because ECC memory protection schemes performed by ECC-capable memory controllers, such as the controller 14, are well known to those skilled in the art, the details of same will not be further described in detail except as necessary to insure a complete understanding of the present invention.

FIG. 2 is a flowchart of the operation of the ECC testing software 20 (FIG. 1) of the present invention. Execution begins in step 200. In step 202, the ECC generation capabilities of the controller 14 are disabled, such that ECC check bits will not be generated for data read from and written to system memory 16. In step 204, a test data pattern that is one bit different than a data pattern that results in an ECC code equal to the natural state of the bus 13 is written to a selected location in system memory 16. For example, assuming in its natural state, the bus 13 is pulled low, a data pattern of 0000000000000000h would result in an ECC code equal to the natural state of the bus 13 (00000000b), such that an appropriate test pattern would be 0000000000000001h; i.e., one bit different than the data value that results in an ECC code of all 0's. It will be recognized that more than one data pattern will result in an ECC code of all 0's. It will also be recognized that any one of the 64 data bits may be designated as the "bad bit," in the above example, a logic 1 value. Accordingly, millions of different test patterns are available for use. Upon the completion of step 204, an ECC code equal to the natural state of the bus 13, in this case 00000000b, and a test pattern that is one bit different than a data pattern that results in an ECC code equal to the natural state of the bus, e.g., 0000000000000001h, have been written to the location in memory 16 to be tested.

In step 206, ECC generation is enabled, such that ECC codes will be generated and compared, by XORing the codes, on each read from and write to memory 16. In step 208, the memory location to which the test data pattern written in step 204 (0000000000000001h) is read and its ECC code generated. This step should result in the detection by the memory controller 14 of an error, as the stored ECC code (00000000b) does not correspond to the read data value (0000000000000001h). In step 210, a determination is made whether the memory controller 14 detected and corrected the error induced as a result of steps 202 and 204. If so, execution proceeds to step 212, in which a determination is made whether the error was reported by the controller 14. If so, execution proceeds to step 214. If in step 210, the data was not corrected or if in step 212 the error was not reported, a failure is reported in step 216, in which case, the memory controller 14 or the entire motherboard (not shown) of the computer 10 must be replaced.

In step 214, a determination is made whether the test of the memory controller 14 is complete. If so, execution proceeds to step 218, in which the memory controller 14 is determined to have passed; otherwise, execution proceeds to step 220. In step 220, test variables are altered, for example, by selecting a different test pattern to be written to memory 16, selecting a different memory location to which to write the test pattern, and/or changing the position in the test pattern of the "bad bit", as desired. Execution then returns to step 202. In this manner, the testing of the memory controller 14 may be made as thorough as necessary to insure the accuracy of the ECC capabilities thereof. It will be recognized that the testing of double bit error detection capabilities of the controller 14 will be performed in a similar manner, except the data value will not be corrected, and hence step 210 will not be performed.

In the foregoing manner, the error detection and correction capabilities of any ECC-capable memory controller having ECC-generation capabilities that may be selectively enabled and disabled can be verified without requiring hardware modification of the controller or computer system.

Although an illustrative embodiment of the invention has been shown and described, other modifications, changes, and substitutions are intended in the foregoing disclosure. For example, it is anticipated that, in a network environment, the ECC testing software 20 may be stored on a network server to be accessed by computers connected to the network for verifying the ECC capabilities of their respective memory controllers. Accordingly, it is appropriate that the appended claims be construed broadly and in a manner consistent with the scope of the invention.

What is claimed is:

1. A method of verifying error checking and correction ("ECC") capabilities of a memory controller electrically connected to a processor via a bus, said memory controller controlling access to a memory device, the method comprising:

disabling said ECC capabilities of said memory controller;

while said ECC capabilities of said memory controller are disabled, writing a test pattern and a first ECC code to a selected location in said memory device, said first ECC code corresponding to a natural state of said bus and said test pattern being at least one bit different than a pattern corresponding to said first ECC code, thereby inducing a memory error;

subsequent to said writing, enabling said ECC capabilities of said memory controller;

subsequent to said enabling, reading data stored at said selected memory location using said memory controller.

2. The method of claim 1 further comprising subsequent to said reading, determining whether said memory error was detected and corrected by said memory controller, wherein if said memory error was not detected and corrected by said memory controller, said memory controller is reported to have failed.

3. The method of claim 1 further comprising subsequent to said reading, determining whether said memory error was reported by said memory controller, wherein if said memory error was not detected and corrected by said memory controller, said memory controller is reported to have failed.

4. The method of claim 1 further comprising, subsequent to said reading, changing at least one test variable.

5. The method of claim 4 wherein said at least one test variable is selected from a group consisting of a memory location to which said test pattern is written, an identity of said test pattern, and a position within said test pattern of a bad bit.

6. The method of claim 1 wherein said memory error is a single bit error and said test pattern is one bit different than a pattern corresponding to said first ECC code.

7. The method of claim 1 wherein said memory error is a double bit error and said test pattern is two bits different than a pattern corresponding to said first ECC code.

8. The method of claim 1 further comprising replacing said memory controller if said memory controller is reported to have failed.

9. A computer program product for verifying error checking and correction ("ECC") capabilities of a memory controller electrically connected to a processor via a bus, said memory controller controlling access to a memory device, the computer program product stored on a computer-readable medium and comprising:
   instructions for disabling said ECC capabilities of said memory controller;
   instructions for writing a test pattern and a first ECC code to a selected location in said memory device while said ECC capabilities of said memory controller are disabled, said first ECC code corresponding to a natural state of said bus and said test pattern being at least one bit different than a pattern corresponding to said first ECC code, thereby inducing a memory error;
   instructions for enabling said ECC capabilities of said memory controller after said writing;
   instructions for reading data stored at said selected memory location using said memory controller subsequent to said enabling.

10. The computer program product of claim 9 further comprising instructions for determining whether said memory error was detected and corrected by said memory controller subsequent to said reading, wherein said memory controller is reported to have failed if said memory error was not detected and corrected by said memory controller.

11. The computer program product of claim 9 further comprising instructions for determining whether said memory error was reported by said memory controller subsequent to said reading, wherein said memory controller is reported to have failed if said memory error was not detected and corrected by said memory controller.

12. The computer program product of claim 9 further comprising instructions for changing at least one test variable subsequent to said reading.

13. The computer program product of claim 12 wherein said at least one test variable is selected from a group consisting of a memory location to which said test pattern is written, an identity of said test pattern, and a position within said test pattern of a bad bit.

14. The computer program product of claim 9 wherein said memory error is a single bit error and said test pattern is one bit different than a pattern corresponding to said first ECC code.

15. The computer program product of claim 9 wherein said memory error is a double bit error and said test pattern is two bits different than a pattern corresponding to said first ECC code.

16. Apparatus for verifying error checking and correction ("ECC") capabilities of a memory controller electrically connected to a processor via a bus and for controlling access to a memory device, the apparatus comprising:
   means for disabling said ECC capabilities of said memory controller;
   means for writing a test pattern and a first ECC code to a selected location in said memory device while said ECC capabilities of said memory controller are disabled, said first ECC code corresponding to a natural state of said bus and said test pattern being at least one bit different than a pattern corresponding to said first ECC code, thereby inducing a memory error;
   means for enabling said ECC capabilities of said memory controller after said writing;
   means for causing said memory controller to read data stored at said selected memory location subsequent to said enabling.

17. The apparatus of claim 16 further comprising:
   means for determining whether said memory error was detected and corrected by said memory controller subsequent to said reading; and
   means for indicating that said memory controller has failed if said memory error was not detected and corrected by said memory controller.

18. The apparatus of claim 16 further comprising:
   means for determining whether said memory error was reported by said memory controller subsequent to said reading; and
   means for indicating that said memory controller has failed if said memory error was not detected and corrected by said memory controller.

19. The apparatus of claim 16 further comprising means for changing at least one test variable subsequent to said reading.

20. The apparatus of claim 19 wherein said at least one test variable is selected from a group consisting of a memory location to which said test pattern is written, an identity of said test pattern, and a position within said test pattern of a bad bit.

21. The apparatus of claim 16 wherein said memory error is a single bit error and said test pattern is one bit different than a pattern corresponding to said first ECC code.

22. The apparatus of claim 16 wherein said memory error is a double bit error and said test pattern is two bits different than a pattern corresponding to said first ECC code.

23. In a computer comprising a memory controller electrically connected to a processor via a bus, said memory controller being for controlling access to a memory device and having error checking and correcting ("ECC") capabilities, an apparatus for verifying the accuracy of said ECC capabilities of said memory controller, the apparatus comprising:
   means for disabling said ECC capabilities of said memory controller;
   means for writing a test pattern and a first ECC code to a selected location in said memory device while said ECC capabilities of said memory controller are disabled, said first ECC code corresponding to a natural state of said bus and said test pattern being at least one bit different than a pattern corresponding to said first ECC code, thereby inducing a memory error;

means for enabling said ECC capabilities of said memory controller after said writing;

means for causing said memory controller to read data stored at said selected memory location subsequent to said enabling;

means for determining, with respect to single bit memory errors, whether said memory error was detected and corrected by said memory controller subsequent to said reading and if not, indicating that said memory controller has failed; and means for determining, with respect to double bit memory errors, whether said memory error was reported by said memory controller subsequent to said reading and if not, indicating that said memory controller has failed.

* * * * *